(12) United States Patent
Jung et al.

(10) Patent No.: US 9,714,977 B2
(45) Date of Patent: Jul. 25, 2017

(54) BURN-IN TEST SYSTEM AND METHOD

(71) Applicants: SK hynix Inc., Icheon-si, Gyeonggi-do (KR); UNITEST INC., Yongin-si, Gyeonggi-do (KR)

(72) Inventors: Woo Sik Jung, Icheon-si (KR); Dae Kyoung Kim, Yongin-si (KR)

(73) Assignees: SK hynix Inc., Icheon-si, Gyeonggi-do (KR); UNITEST INC., Yongin-si, Gyeonggi-do (KR)

( * ) Notice: Subject to any disclaimer, the term of this patent is extended or adjusted under 35 U.S.C. 154(b) by 76 days.

(21) Appl. No.: 14/855,641

(22) Filed: Sep. 16, 2015

(65) Prior Publication Data
US 2016/0334462 A1 Nov. 17, 2016

(30) Foreign Application Priority Data
May 14, 2015 (KR) ........................ 10-2015-0067228

(51) Int. Cl.
*G01R 31/10* (2006.01)
*G01R 31/28* (2006.01)

(52) U.S. Cl.
CPC ..... *G01R 31/2862* (2013.01); *G01R 31/2867* (2013.01)

(58) Field of Classification Search
CPC ............ G01R 31/2862; G01R 31/2619; G01R 31/2601; H01L 31/0465; H01L 31/202; H01L 22/34

USPC ... 324/500, 750.03–750.13, 750.3, 670, 685, 324/431, 441, 224, 200, 750.28
See application file for complete search history.

(56) References Cited

U.S. PATENT DOCUMENTS

| | | | |
|---|---|---|---|
| 4,668,840 A | * | 5/1987 | Kiyama ................ H01L 31/202 136/244 |
| 2012/0062262 A1 | * | 3/2012 | Lee .................... G01R 31/2893 324/757.04 |

FOREIGN PATENT DOCUMENTS

KR 1020150021688 A 3/2015

* cited by examiner

*Primary Examiner* — Melissa Koval
*Assistant Examiner* — Trung Nguyen
(74) *Attorney, Agent, or Firm* — William Park & Associates Ltd.

(57) ABSTRACT

A burn-in test system may include a burn-in test chamber, a heating chamber and a cooling chamber. The burn-in test chamber may receive an object thereon. The burn-in test chamber may perform a burn-in test at a burn-in test temperature. The heating chamber may be positioned at a first sidewall of the burn-in test chamber, and may preheat the object. The cooling chamber may be positioned at a second sidewall of the burn-in test chamber, and may cool the object.

14 Claims, 11 Drawing Sheets

BURN-IN TEST SYSTEM AND METHOD

CROSS-REFERENCES TO RELATED APPLICATION

The present application claims priority under 35 U.S.C. §119(a) to Korean application number 10-2015-0067228 filed on May 14, 2015, in the Korean Intellectual Property Office, which is incorporated herein by reference in its entirety.

BACKGROUND

1. Technical Field

Various embodiments generally relate to an integrated circuit test system, more particularly to a burn-in test system and method capable of reducing a test time.

2. Related Art

After an assembly process of a semiconductor device, a burn-in test may be performed on the semiconductor device. Burn-in test is a stress test that employs voltage and temperature to accelerate the electrical failure of a semiconductor device. For instance, the burn-in test simulates the semiconductor device by applying electrical stresses thereto at a temperature higher than a room temperature.

The burn-in test may be performed in a burn-in test chamber employing the worst-case temperature and pressure to which the semiconductor device will be subject. A plurality of the burn-in test chambers, which communicate with a server, may be arranged in a burn-in system.

Device under test (hereinafter referred to as "DUT") may refer to a manufactured product undergoing testing. During the burn-in test, a plurality of DUTs may be mounted on a burn-in board, and the burn-in board may be loaded into the burn-in test chamber. The burn-in test chamber into which the DUTs have been loaded may be heated to a burn-in test temperature. After the completion of the burn-in test, the burn-in test chamber may be cooled, and the DUTs may be unloaded from the burn-in test chamber.

SUMMARY

According to example embodiments, there may be provided a burn-in test system may include a burn-in test chamber, a heating chamber and a cooling chamber. The burn-in test chamber may be configured to receive an object. The burn-in test chamber may have a burn-in test temperature. The heating chamber may be positioned at an entrance of the burn-in test chamber to pre-heat the object. The cooling chamber may be positioned at an exit of the burn-in test chamber to cool the object.

According to example embodiments, there may be provided a burn-in test system. The burn-in test system may include a burn-in chamber block, a temperature-controlling block and a transferring block. The burn-in chamber block may include a plurality of burn-in test chambers configured to receive objects. The temperature-controlling block may be arranged separately from the burn-in chamber block. The temperature-controlling block may be configured to pre-process and post-process the objects. The transferring block may transfer the objects between the burn-in chamber block and the temperature-controlling block.

According to example embodiments, there may be provided a burn-in test method. In the burn-in test method, a first rack in which a first object may be received may be loaded into a heating chamber. The first rack may be pre-heated. The first rack may be loaded into a burn-in test chamber. A second rack in which a second object may be received may be loaded into the heating chamber. The second rack may be pre-heated during heating the first rack in the burn-in test chamber. The first rack may be loaded into a cooling chamber. The second rack may be loaded into the burn-in test chamber. A third rack in which a third object may be received may be loaded into the heating chamber. The second rack in the burn-in test chamber may be heated and the third rack in the heating chamber may be preheated simultaneously with cooling the first rack in the cooling chamber.

BRIEF DESCRIPTION OF THE DRAWINGS

Example embodiments can be understood in more detail from the following detailed description taken in conjunction with the accompanying drawings.

FIG. 1 is a plan view illustrating a burn-in test system in accordance with example embodiments;

FIG. 2 is a perspective view illustrating a burn-in test chamber;

FIG. 3 is a perspective view illustrating a burn-in board;

FIG. 4 is a perspective view illustrating a rack with a plurality of burn-in boards;

FIG. 5 is a block diagram illustrating a burn-in test system in accordance with example embodiments;

FIG. 6 is a flow chart illustrating a burn-in test method in accordance with example embodiments;

FIG. 7 is a timing chart illustrating burn-in test system and method in accordance with example embodiments;

FIG. 8 is a timing chart illustrating known burn-in test system and method; and

FIGS. 9 to 11 are plan views illustrating burn-in systems in accordance with example embodiments.

DETAILED DESCRIPTION

Figure 1:
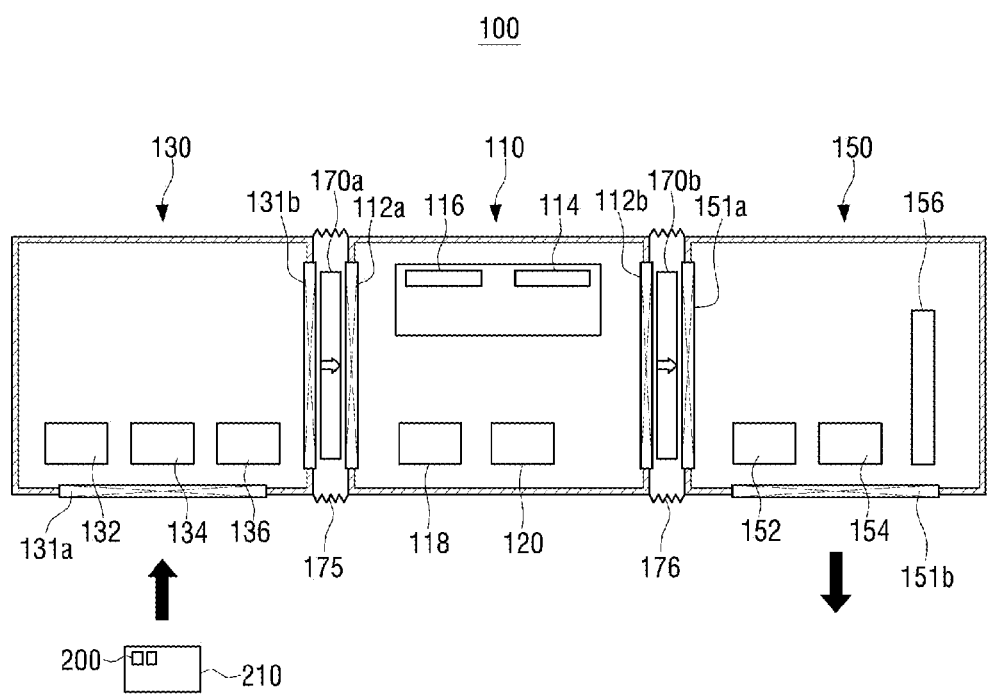
FIGS. 1 to 11 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a plan view illustrating a burn-in test system in accordance with example embodiments.

Referring to FIG. 1, a burn-in test system 100 may include a burn-in test chamber 110, a heating chamber 130, and a cooling chamber 150.

The burn-in test chamber 110 may apply heat to a plurality of DUTs to cause thermal stresses and then detect defects occurred under high temperature, high pressure conditions. The DUTs may include a semiconductor chip, a semiconductor package, semiconductor module, etc.

Figure 2:
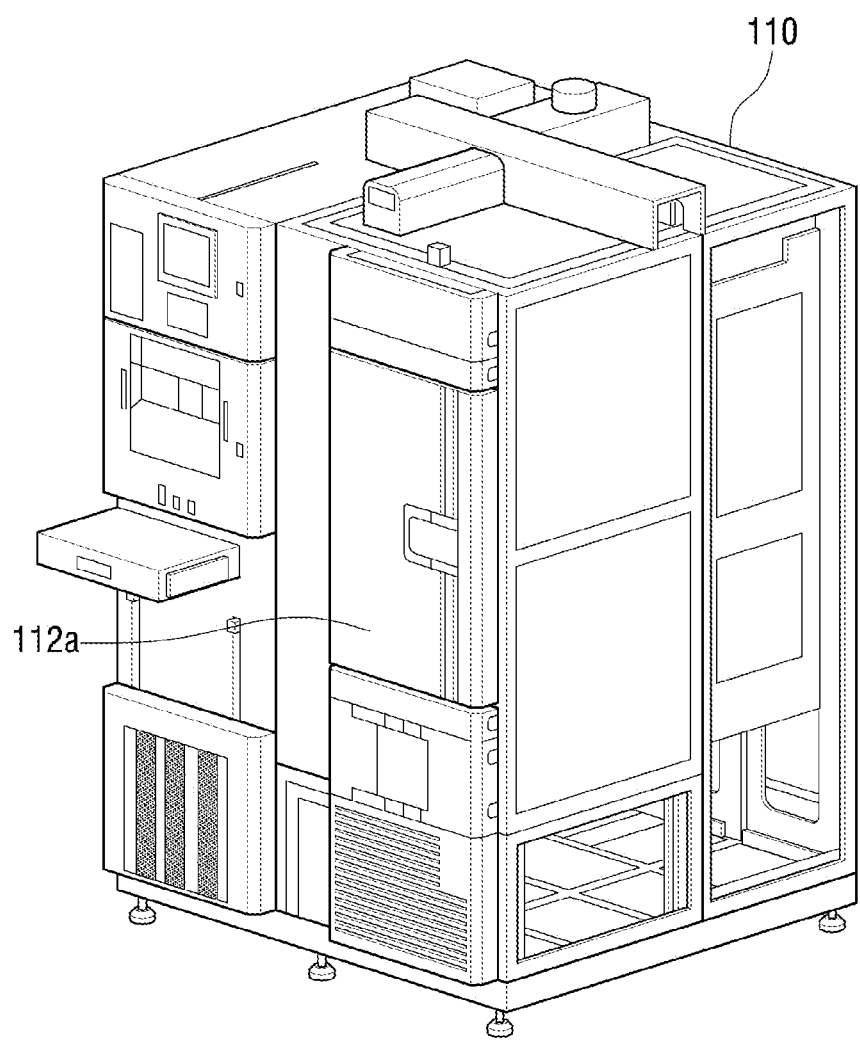

FIG. 2 is a perspective view illustrating a burn-in test chamber.

Referring to FIGS. 1 and 2, the burn-in test chamber 110 may include insertion and ejection slots 112a and 112b through which burn-in boards 210 with the DUTs 200 are to be inserted or ejected.

Figure 3:
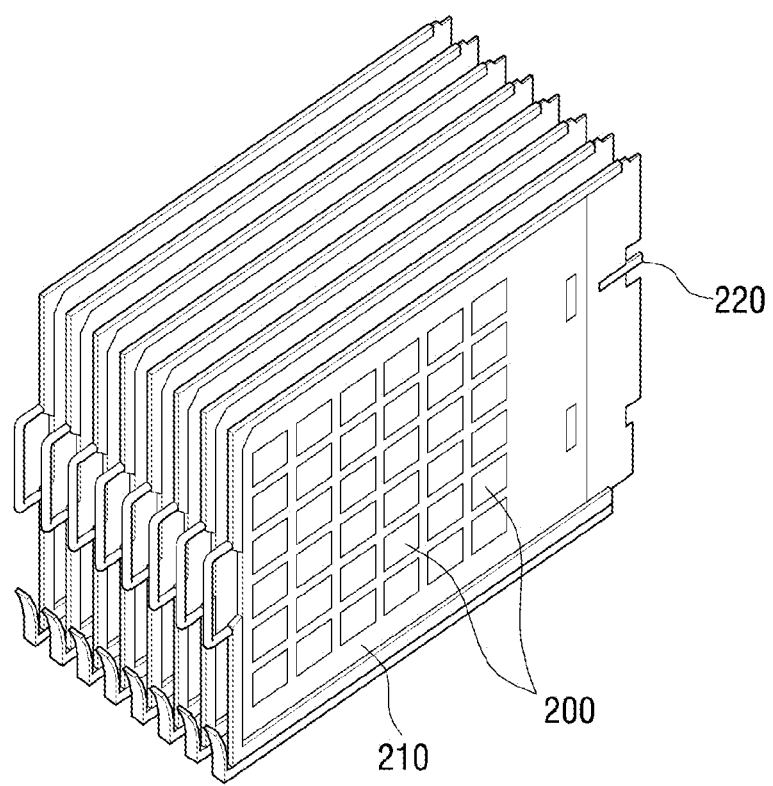

FIG. 3 is a perspective view illustrating a burn-in board.

Referring to FIG. 3, the DUTs 200 loaded into the burn-in test chamber 110 may include a semiconductor package. A plurality of the DUTs 200 may be mounted on the burn-in board 210. The burn-in board 210 may include a connector 220.

Figure 4:
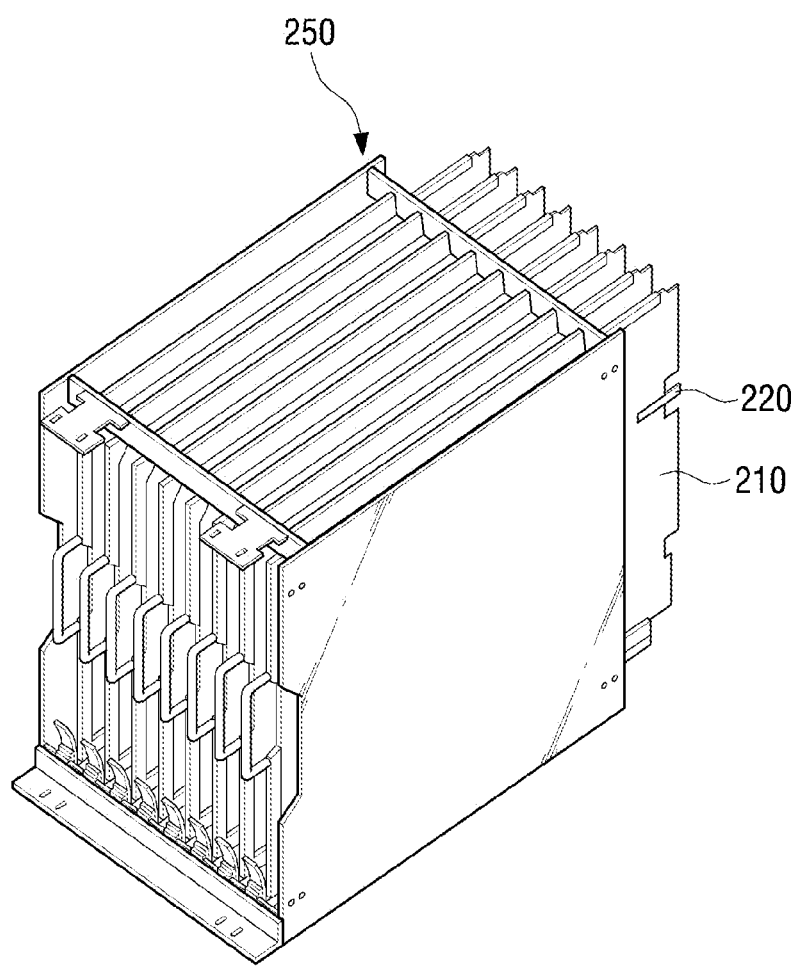

FIG. 4 is a perspective view illustrating a rack with a plurality of burn-in boards.

Referring to FIG. 4, the burn-in boards 210 may be received on a rack 250. The rack 250 may be loaded into the burn-in chamber 110. The rack 250 may have a plurality of slots to receive the burn-in boards 210.

Referring to FIGS. 1 and 4, the burn-in test chamber 110 may include a test room 114 in which a burn-in test may be performed. A test board 116 may be arranged over one side of the test room 114. The test board 116 may be electrically connected to the connector 220 of the burn-in board 210. Particularly, the DUTs 200 may be mounted on the burn-in boards 210. The burn-in boards 210 may be mounted on the rack 250. The rack 250 may be loaded into the test room 114. The connectors 220 of the burn-in boards 210 may be electrically connected to the test board 116 in the test room 114 to perform the burn-in test. The test room 114 may include a temperature controller such as a chiller, a process control water (hereinafter referred to as "PCW"), etc.

The burn-in chamber 110 may include a manipulator 118. The manipulator 118 may guide the burn-in board 210 loaded into the burn-in chamber 110 toward the test board 116. The manipulator 118 may firmly hold the burn-in board 210 to stably connect the burn-in board 210 to the test board 116. The manipulator 118 may unload the burn-in board 210 from the burn-in chamber 110.

The burn-in chamber 110 may include a burn-in controller 120. The burn-in controller 120 may store test results. The burn-in controller 120 may control the manipulator 118, the insertion and ejection slots 112a and 112b. The test results stored in the burn-in controller 120 may be transmitted to a sorter for determining whether the DUT may be normal or not.

The heating chamber 130 may be arranged adjacent to the burn-in chamber 110. The heating chamber 130 may be positioned adjacent to the insertion slot 112a of the burn-in chamber 110.

The heating chamber 130 may include an insertion slot 131a, an ejection slot 131b, a heater 132, a manipulator 134 and a temperature controller 136. The burn-in board 210 may be loaded into the heating chamber 130 through the insertion slot 131a.

The heater 132 may preheat the burn-in board 210 in the heating chamber 130 to a temperature of about 50% to about 100% of a test temperature. In order to prevent the burn-in board 210 from being stressed by the preheating process in the heating chamber 130, the heater 132 may warm up the burn-in board 210 to a temperature of about 80% of the test temperature just before loading the burn-in board 210 into the burn-in chamber 110.

The manipulator 134 may transfer the burn-in board 210 to the heater 132. The manipulator 134 may unload the preheated burn-in board 210 from the heating chamber 130 through the ejection slot 131b.

The cooling chamber 150 may be positioned adjacent to the ejection slot 112b of the burn-in chamber 110. The tested burn-in boards 210 may be loaded into the cooling chamber 150. The cooling chamber 150 may cool the burn-in boards 210 to a room temperature.

The cooling chamber 150 may include an insertion slot 151a, an ejection slot 151b, a manipulator 152 and a temperature controller 154. The manipulator 152 may unload the cooled burn-in board 210 from the cooling chamber 150. The temperature controller 154 may control the insertion slot 151a, the ejection slot 151b and the manipulator 152. Further, the temperature controller 154 may control a cooling speed, a cooling temperature, etc.

In order to rapidly cool the burn-in board 210, the cooling chamber 150 may include a cooling member 156. The cooling member 156 may include a chiller, a PCW, etc. The temperature controller 154 may control the cooling member 156.

A first transferring member 170a may be arranged between the ejection slot 131b of the heating chamber 130 and the insertion slot 112a of the burn-in chamber 110. The first transferring member 170a may be adiabatic to maintain the temperature of the preheated burn-in board 210. A first adiabatic layer 175 may be formed on the first transferring member 170a.

A second transferring member 170b may be arranged between the ejection slot 112b of the burn-in chamber 110 and the insertion slot 151a of the cooling chamber 150. The second transferring member 170b may be adiabatic to maintain the temperature of the tested burn-in board 210. A second adiabatic layer 176 may be formed on the second transferring member 170b.

The first transferring member 170a and the second transferring member 170b may include a conveyor system that moves the burn-in board 210.

Figure 5:
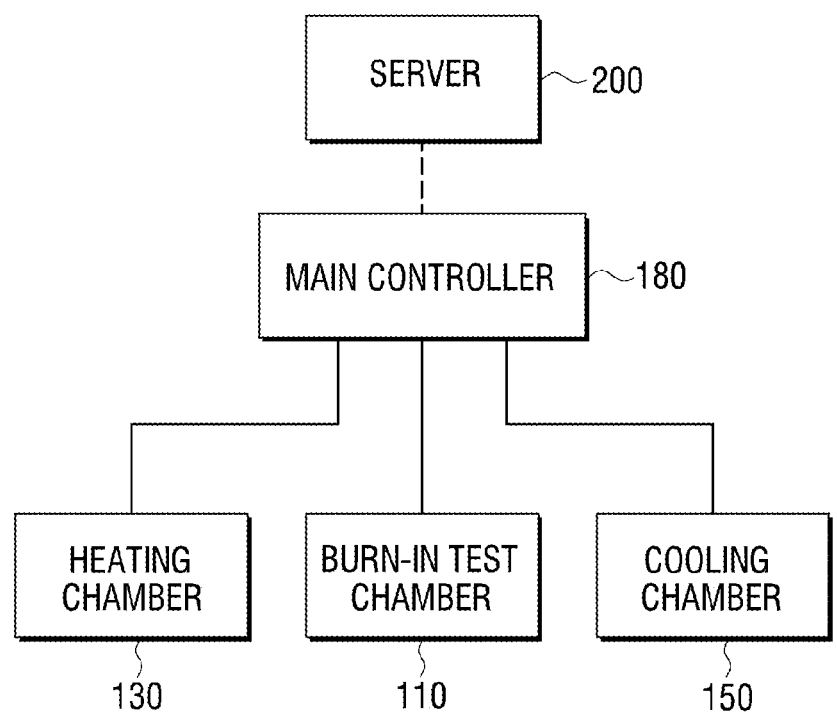

In example embodiments, the burn-in chamber 110, the heating chamber 130 and the cooling chamber 150 may include the temperature controllers 120, 136 and 154. Alternatively, as shown in FIG. 5, a main controller 180 may totally control the burn-in chamber 110, the heating chamber 130 and the cooling chamber 150.

The main controller 180 may communicate with a server 200 via a wire or wireless connection to totally manage the burn-in test process performed with the sorter. Alternatively, a plurality of controllers may be provided to the chambers 110, 130 and 150 so that each controller may individually manage the burn-in test process by sharing necessary information.

Figure 6:
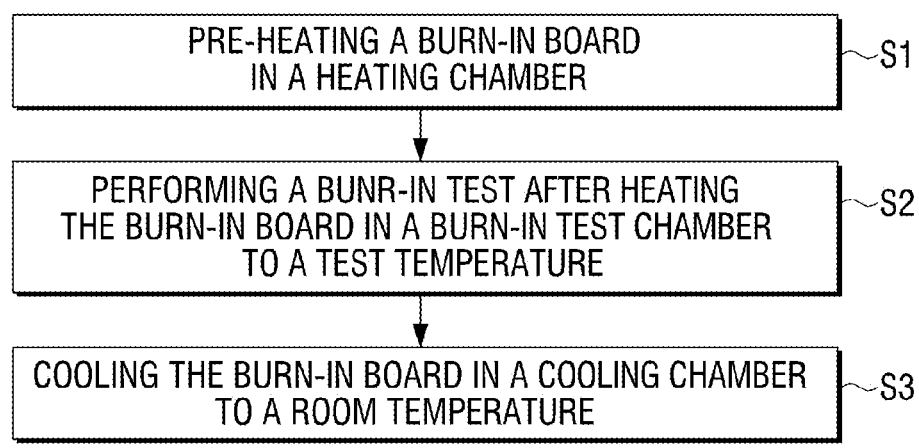

FIG. 6 is a flow chart illustrating a burn-in test method in accordance with example embodiments.

Referring to FIG. 6, in step S1, a burn-in board 210 receiving the DUT thereon may be loaded into the heating chamber 130. The burn-in board 210 with the DUT may be preheated to a temperature of about 50% to about 100% of the test temperature.

In step S2, the burn-in board 210 may be loaded into the burn-in test chamber 110. The burn-in board 210 may be heated to the test temperature to perform the burn-in test. Because the burn-in board 210 is loaded into the burn-in chamber 110 when it has reached about 50% to about 100% of the test temperature, the burn-in board 210 may rapidly reach the test temperature. Various stresses such as high temperature and high pressure may be applied to the burn-in board 210 to determine whether there is a high probability that the DUT will become defective under such stresses.

In step S3, the burn-in board 210 may be loaded into the cooling chamber 150. The burn-in board 210 in the cooling chamber 150 may be cooled to the room temperature.

Figure 7:
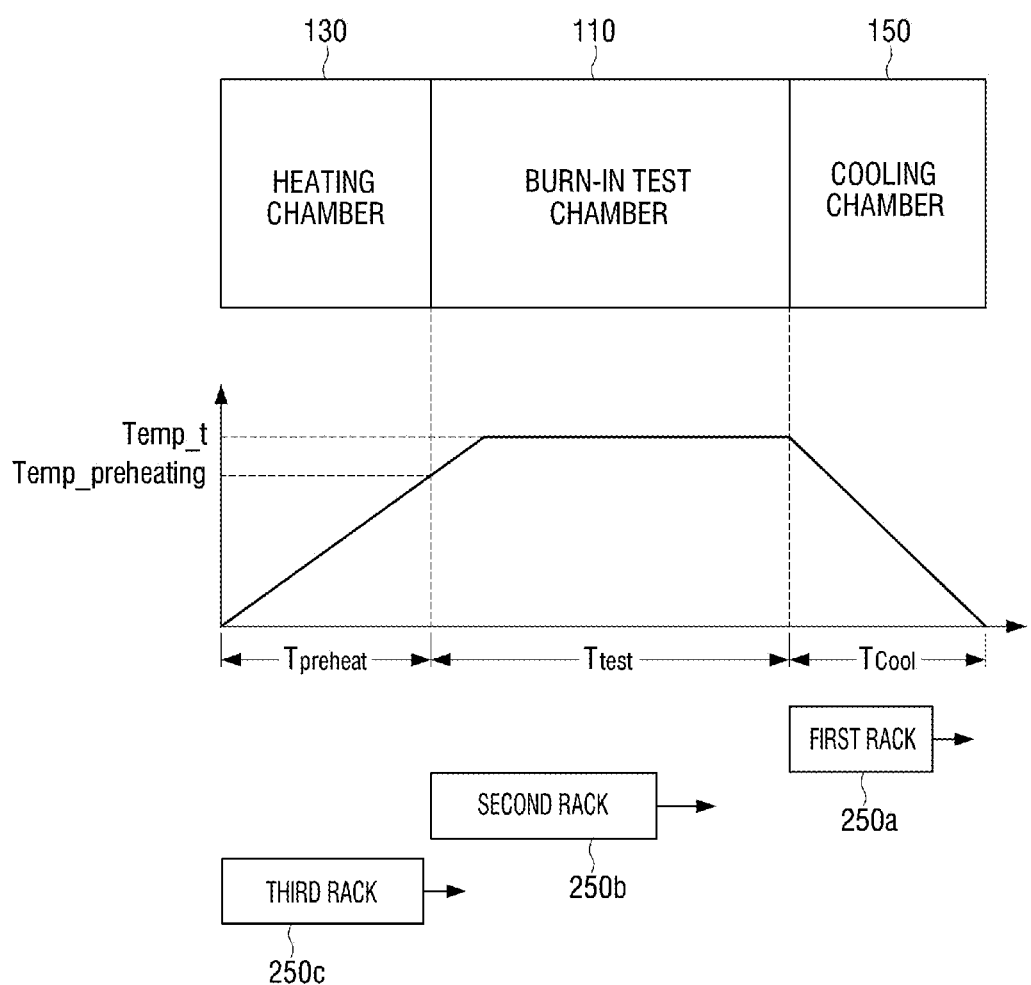

FIG. 7 is a timing chart illustrating burn-in test system and method in accordance with example embodiments.

Referring to FIG. 7, the burn-in board 210 may be preheated to a preheat temperature Temp_preheating of about 50% to about 100% of the test temperature for a preheating period of time Tpreheat. The burn-in board 210 may be transferred to the burn-in chamber 110. In FIG. 7, the preheat temperature Temp_preheating may be lower than the test temperature Temp_t. Alternatively, the preheat temperature Temp_preheating may be substantially the same as the test temperature Temp_t.

The burn-in board 210 may be finally heated to the test temperature Temp_t in the burn-in chamber 110. The burn-in test process may be performed on the burn-in board 210 in the burn-in chamber 110. In FIG. 7, a burn-in test time Ttest may represent a period of time the burn-in test is performed in the burn-in chamber 110. Because the burn-in board 210 may be preheated to the temperature of about 50% to about 100% of the test temperature, the burn-in board 210 may rapidly reach the test temperature Temp_t.

The burn-in board 210 may be loaded into the cooling chamber 150. The burn-in board 210 may be cooled for a cooling time Tcool. The burn-in board 210 may be unloaded from the cooling chamber 150.

Figure 8:
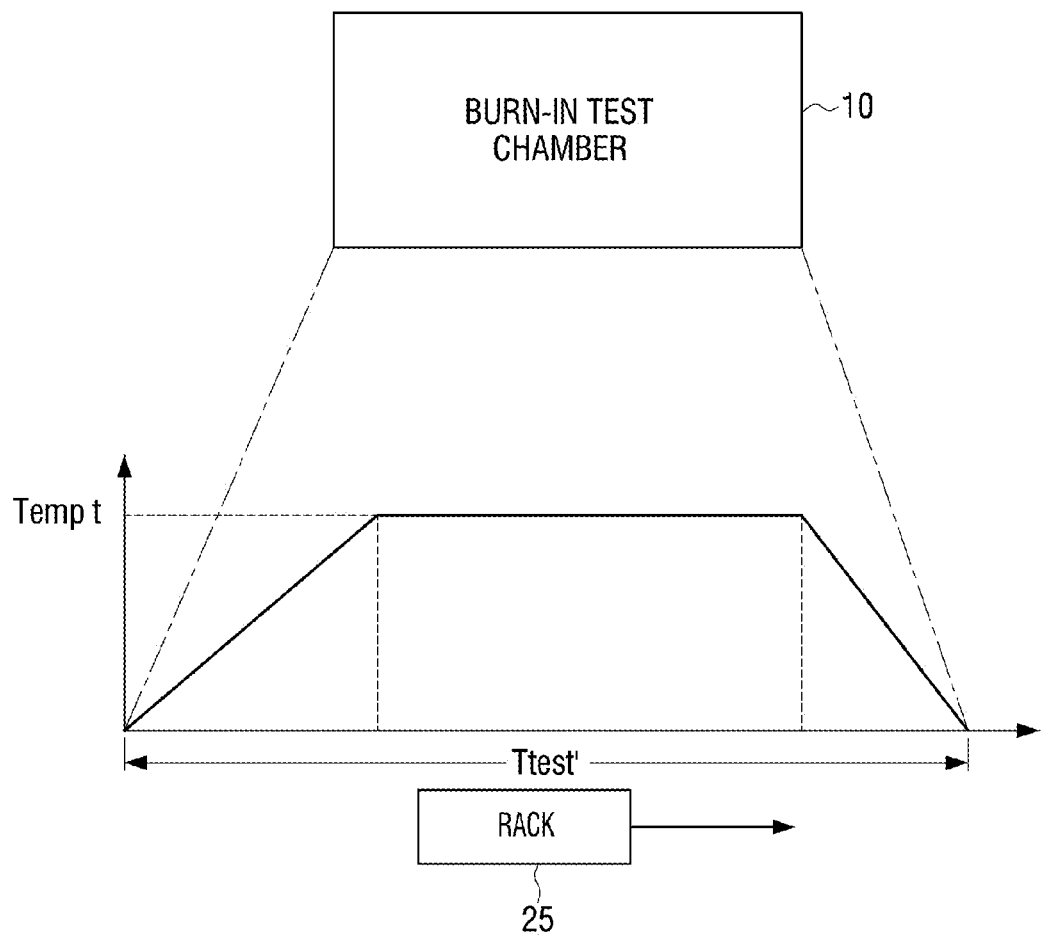

FIG. 8 is a timing chart illustrating a burn-in test system and method.

Referring to FIG. 8, after loading the burn-in board 210 into the burn-in chamber 110, the heating process, the burn-in test process and the cooling process may be performed on the burn-in board 210 in the burn-in chamber 110. Thus, a burn-in test time Ttest' may include a heating time Theat, the burn-in test time Ttest and the cooling time Tcool.

In contrast, the system in example embodiments may include a heating chamber 130 and a cooling chamber 150, which are separated from the burn-in chamber 110, to reduce the burn-in test time Ttest.

Further, the system including the separate heating and cooling chambers 130 and 150 may improve efficiency in the burn-in test.

In an embodiment, a first rack 250a receiving the burn-in boards 210 may be preheated in the heating chamber 130. After the first rack 250a is transferred to the burn-in chamber 110, a second rack 250b may be loaded into the heating chamber 130 to be preheated.

While performing the burn-in test on the first rack 250a, the second rack 250b may be preheated in the heating chamber 130. After performing the burn-in test on the first rack 250a, the second rack 250b may be transferred to the burn-in chamber 110 and a third rack 250c may be loaded into the heating chamber 130 while transferring the first rack 250a to the cooling chamber 150.

Thus, the racks 250a, 250b and 250c may be sequentially loaded into the heating chamber 130, the burn-in chamber 110 and the cooling chamber 150. Therefore, the total burn-in test time for a plurality of burn-in boards may decrease.

In contrast, if all of the heating process, the test process and the cooling process are performed in the burn-in chamber 10 as shown in FIG. 8, only one rack 25 may be tested for the test time Ttest', thereby increasing the total burn-in test time.

Further, as shown in FIG. 7, the burn-in chamber 110 in an example embodiment may be maintained at the uniform test temperature without repeating periodical heating and cooling, thereby decreasing a probability of a test failure caused by a frequent temperature change of the burn-in chamber 110.

Figure 9:
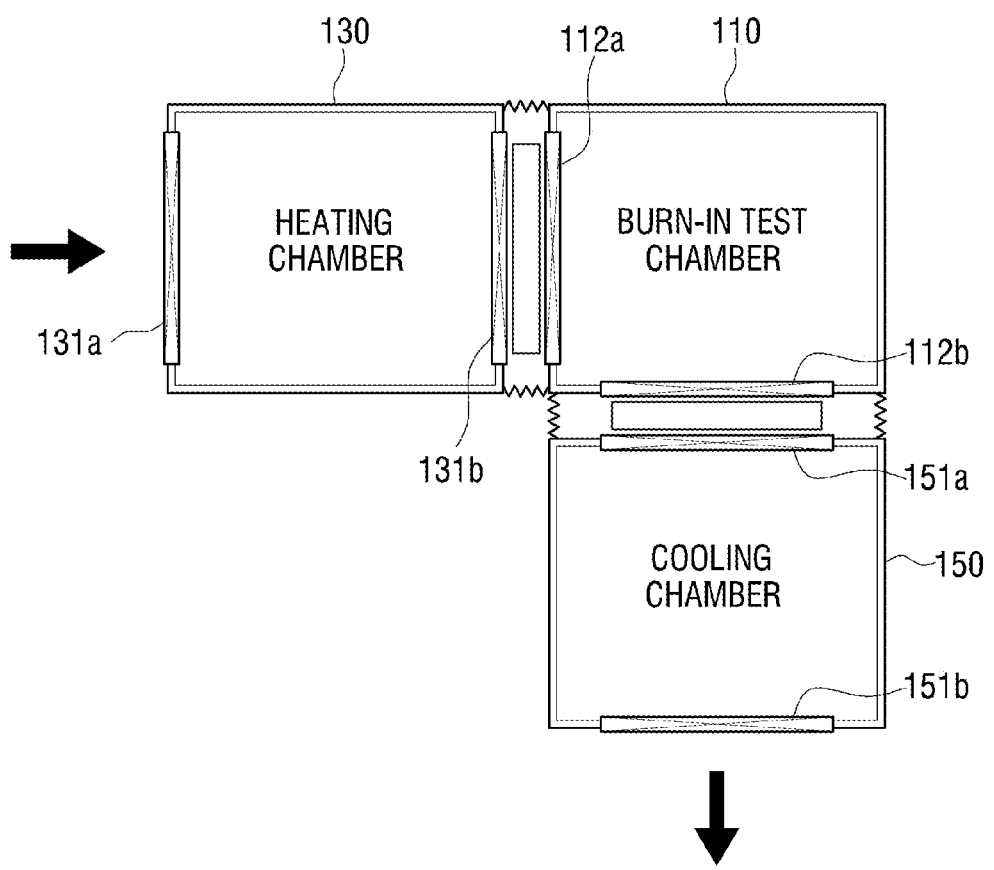
Figure 10:
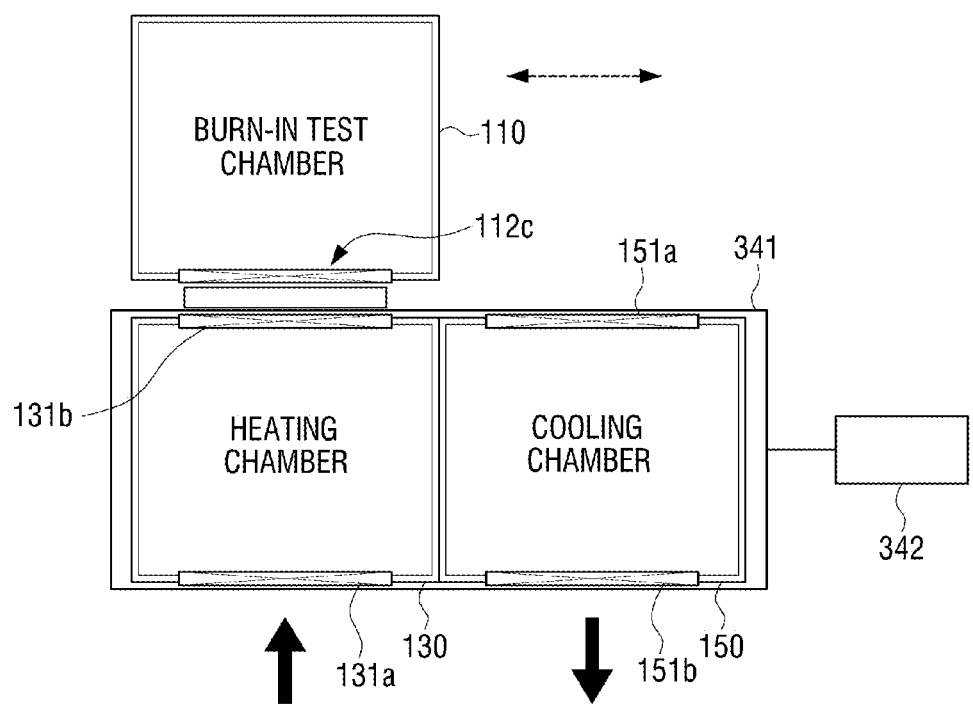
Figure 11:
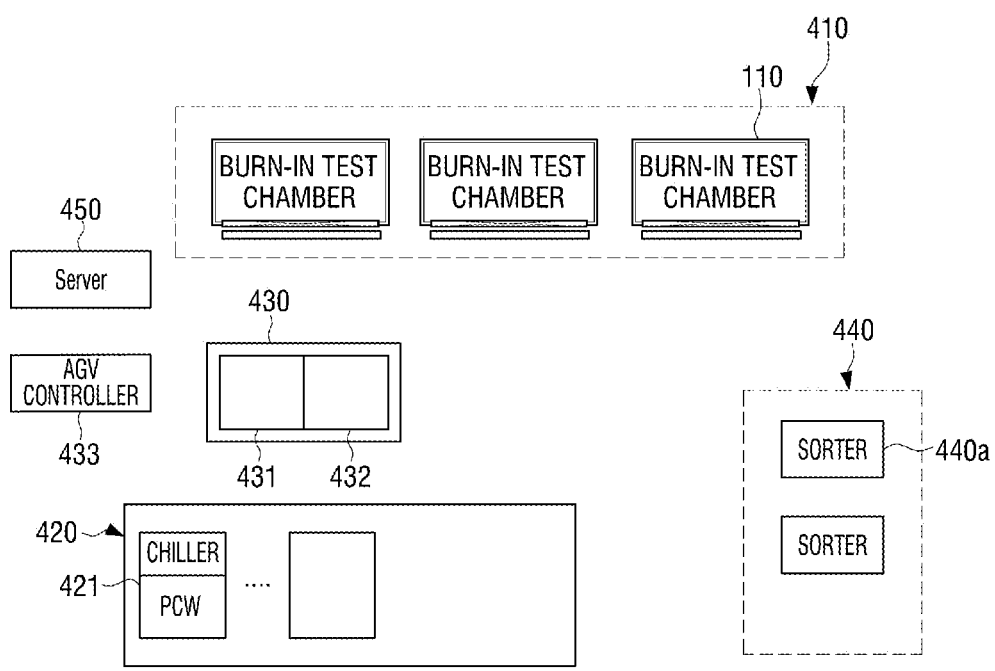

FIGS. 9 to 11 are plan views illustrating burn-in systems in accordance with example embodiments.

Referring to FIG. 9, the heating chamber 110, the burn-in chamber 110 and the cooling chamber 150 may be arranged in an L shape. Particularly, the insertion and ejection slots 112a and 112b of the burn-in chamber 110 may be located at side walls of the burn-in chamber 110, which are perpendicular to each other. The heating chamber 130 may be arranged adjacent to the insertion slot 112a of the burn-in chamber 110. The cooling chamber 150 may be arranged adjacent to the ejection slot 112b of the burn-in chamber 110. Thus, the burn-in board or the rack may be transferred to the direction represented by arrows.

Referring to FIG. 10, the burn-in chamber 110 may include only one slot 112c. The heating chamber 130 and the cooling chamber 150 may be arranged adjacent to the slot 112c of the burn-in chamber 110. The heating chamber 130 and the cooling chamber 150 may be positioned over a moving frame 341. The moving frame 341 may be connected to an actuator 342. The moving frame 341 may switch positions of the heating chamber 130 and the cooling chamber 150.

When the preheated burn-in board in the heating chamber 130 is loaded into the burn-in chamber 110, the moving frame 341 may move to align an ejection slot 131b of the heating chamber 130 with the slot 112c of the burn-in chamber 110. After performing the burn-in test, the moving frame 341 may move to align the slot 112c of the burn-in chamber 110 with an insertion slot 151a of the cooling chamber 150 to load the burn-in board into the cooling chamber 150.

In example embodiments, the positions of the heating chamber 130 and the cooling chamber 150 may vary. The positions and numbers of the slots of the chambers 110, 130 and 150 may vary in accordance with arrangements of the chambers 110, 130 and 150. Further, additional devices may be provided between the chambers 110, 130 and 150 to load and unload the burn-in boards.

Referring to FIG. 11, a burn-in test system in an example embodiment may include a burn-in chamber block 410, a temperature-controlling block 420 and a transferring block 430.

The burn-in chamber block 410 may include a plurality of burn-in test chambers 110. The burn-in test chambers 110 may be maintained at the test temperature. A burn-in test may be performed in each of the burn-in test chambers 110.

The temperature-controlling block 420 may be separated from the burn-in chamber block 410. The temperature-controlling block 420 may be provided to perform pre-process and post-process for the burn-in test with respect to the DUT or the burn-in board receiving the DUT thereon. The temperature-controlling block 420 may include at least one temperature-controlling chamber 421. The temperature-controlling chamber 421 may include the heating chamber 130 and/or the cooling chamber 150. That is, the temperature-controlling chamber 421 may include the heating chamber 130 that preheats the DUT to the temperature of about 50% to about 100% of the test temperature, and the cooling chamber 150 that cools the DUT to the room temperature. The temperature-controlling block 420 may include a battery that supplies power to an automated guided vehicle. The temperature-controlling chamber 421 may include a chiller or a PCW.

The transferring block 430 may move between the burn-in chamber block 410 and the temperature-controlling block 420. The transferring block 430 may transfer an object without changing the temperature thereof. The transferring block 430 may include a plurality of adiabatic chambers 431 and 432. The adiabatic chamber 431 may transfer the object, which has been preheated in the heating chamber of the temperature-controlling block 420, to the burn-in chamber block 410 without changing the temperature thereof. Further, in order to prevent the object on which the burn-in test has been completed from being damaged by a rapid cooling, the adiabatic chamber 432 of the transferring block 430 may transfer the objects from the burn-in chamber block 410 to the temperature-controlling block 420 while minimizing a change in temperature. The adiabatic chambers 431 and 432 of the transferring block 430 may sort and receive the objects before and after the burn-in test.

The temperature-controlling block 420 may be coupled to the adiabatic chambers 431 and 432 of the transferring block 430 to control temperatures of the adiabatic chambers 431 and 432. In this case, the temperature-controlling block 420 may heat or cool the adiabatic chambers 431 and 432 of the transferring block 430 without an additional temperature-controlling chamber. The temperature-controlling block 420 controlling the temperatures of the adiabatic chambers 431 and 432 may be one of an electric heat type, an air circulation type, a heat medium circulation type, etc. The adiabatic chambers 431 and 432 may include a coupling member (not shown) that thermally exchanges heat with a heat source.

For example, when the adiabatic chamber 431 includes the electric heat type, the adiabatic chamber 431 transferring the object from the temperature-controlling block 420 to the burn-in chamber block 410 may include an electric heating wire. The adiabatic chamber 432 transferring the DUT from the burn-in chamber block 410 to the temperature-controlling block 420 may include a thermoelectric element.

The transferring block 430 may include a vehicle or an automated guided vehicle (hereinafter referred to as "AGV"). The burn-in test system may include an AGV controller 433 that controls the AGV.

The burn-in test system may include a sorting block 440. The sorting block 440 may include a plurality of sorters 440a that sorts and receives the object in accordance with test results. The sorting block 440 may be located at a space separated from the burn-in chamber block 410 and the temperature-controlling block 420.

The burn-in test system may include a server 450. The server 450 may store burn-in test results. The server 450 may be interlocked with the AGV controller 433 to control the temperature-controlling block 420, the transferring block 430 and the sorting block 440 in accordance with operations of the burn-in chamber block 410.

According to example embodiments, the heating chamber, the burn-in chamber and the cooling chamber may be arranged separately in the burn-in test system to reduce the burn-in test time. Further, a probability of a test failure caused by a frequent temperature change of the burn-in chamber may decrease.

While various embodiments have been described above, it will be understood to those skilled in the art that the embodiments described are by way of example only. Accordingly, the circuit and method described herein should not be limited based on the described embodiments.

What is claimed is:

1. A burn-in test system comprising:
a burn-in test chamber configured to perform a burn-in test at a test temperature;
a heating chamber arranged at a first sidewall of the burn-in test chamber, wherein the heating chamber is configured to preheat an object;
a cooling chamber arranged at a second sidewall the burn-in test chamber, wherein the cooling chamber is configured to cool the object to a room temperature; and
a transferring member configured to transfer the object between the burn-in test chamber and the heating chamber, and between the burn-in test chamber and the cooling chamber,
wherein the transferring member is shielded by adiabatic layer.

2. The burn-in test system of claim 1, wherein a plurality of the objects is mounted on a burn-in board.

3. The burn-in test system of claim 2, wherein a plurality of the burn-in boards is received on a rack.

4. The burn-in test system of claim 1, wherein the heating chamber is configured to heat the object to a temperature of about 50% to about 100% of the test temperature.

5. The burn-in test system of claim 1, wherein the burn-in test chamber comprises a test room configured to heat the object to the test temperature, maintain the test temperature of the object, and perform a burn-in test.

6. The burn-in test system of claim 1, wherein the heating chamber, the burn-in test chamber and the cooling chamber are arranged in a line.

7. The burn-in test system of claim 1, wherein the burn-in test chamber comprises an insertion slot adjacent to the heating chamber and an ejection slot adjacent to the cooling chamber, and the insertion and ejection slots of the burn-in test chamber are substantially perpendicular to each other.

8. The burn-in test system of claim 1, wherein the burn-in chamber comprises one slot, the heating chamber and the cooling chamber are connected to each other, and the heating chamber and the cooling chamber are movable to be alternately connected to the slot of the burn-in test chamber.

9. A burn-in test system comprising:
a burn-in chamber block including a plurality of burn-in chambers;
a temperature-controlling block configured to be separated from the burn-in chamber block, wherein the temperature-controlling block is provided to perform pre-process and post-process for a burn-in test with respect to an object; and
a transferring block configured to transfer the object between the burn-in chamber block and the temperature-controlling block,
wherein the transferring block comprises a plurality of adiabatic chambers.

10. The burn-in test system of claim 9, wherein the temperature-controlling block comprises at least one temperature-controlling chamber, and the temperature-controlling chamber comprises:
a heating chamber configured to heat the object to a temperature of about 50% to about 100% of a test temperature; and
a cooling chamber configured to cool the object to a room temperature.

11. The burn-in test system of claim 9, wherein the temperature-controlling block is combined with the adiabatic chambers of the transferring block to heat or cool the adiabatic chambers.

12. The burn-in test system of claim 9, further comprising:
a sorting block configured to sort and receive the objects in accordance with test results; and
a server configured to store the test results and control the temperature-controlling block, the transferring block and the sorting block.

13. A burn-in test method comprising:
Loading, into a heating chamber, a first rack receiving an object thereon;
preheating the first rack in the heating chamber;
loading the first rack into a burn-in test chamber, and loading, into the heating chamber, a second rack receiving an object thereon;
preheating the second rack in the heating chamber while heating the first rack in the burn-in test chamber;
loading, into the heating chamber, a third rack receiving an object thereon after loading the first rack into a cooling chamber, and loading the second rack into the burn-in test chamber; and
performing a burn-in test on the second rack in the burn-in test chamber while cooling the first rack in the cooling chamber and preheating the third rack in the heating chamber,
wherein the first, the second and the third racks are simultaneously processed in a burn-in system including the heating chamber, the burn-in test chamber and the cooling chamber.

14. The burn-in test method of claim 13, wherein the first to third racks are heated to a temperature of about 50% to about 100% of a test temperature in the heating chamber.

* * * * *